United States Patent [19]

Mori et al.

[11] Patent Number: 5,393,934
[45] Date of Patent: Feb. 28, 1995

[54] BUSBAR CONDUCTOR

[75] Inventors: Akio Mori; Akiyoshi Sato; Masahiro Suguro; Makota Nakayama, all of Shizuoka, Japan

[73] Assignee: Yazaki Corporation, Tokyo, Japan

[21] Appl. No.: 203,515

[22] Filed: Feb. 28, 1994

Related U.S. Application Data

[63] Continuation of Ser. No. 121,222, Sep. 14, 1993, abandoned, which is a continuation of Ser. No. 841,378, Feb. 25, 1992, abandoned.

[30] Foreign Application Priority Data

Feb. 28, 1991 [JP] Japan ................................. 3-55545

[51] Int. Cl.$^6$ ............................................. H05K 1/00
[52] U.S. Cl. ..................... 174/257; 174/256; 174/99 B; 361/784
[58] Field of Search ................... 174/11 B, 99 B, 256, 174/257, 261; 361/748, 784

[56] References Cited

U.S. PATENT DOCUMENTS

| | | | |
|---|---|---|---|
| 3,636,233 | 1/1972 | Swampillai et al. | 174/99 B |
| 3,647,935 | 3/1972 | Philofsky et al. | 174/257 |
| 4,361,175 | 11/1982 | Criss et al. | 174/257B |
| 4,791,239 | 12/1988 | Shirahata et al. | 174/257 X |

*Primary Examiner*—Leo P. Picard
*Assistant Examiner*—Cheryl R. Figlin
*Attorney, Agent, or Firm*—Krass & Young

[57] ABSTRACT

In making busbar conductors, this invention saves the material of busbars that form the circuits on the boards to lower the cost, and improves the workability of the busbars to be punched. In busbar conductors each having a plurality of busbars of desired patterns arranged on an insulating substrate, the busbars are punched out selectively from two or more conductive materials with different conductivities.

6 Claims, 4 Drawing Sheets

BUSBAR CONDUCTOR

This is a continuation of application Ser. No. 08/121,222, filed on Sep. 14, 1993, now abandoned, which is a continuation of application Ser. No. 07/841,378, filed on Feb. 25, 1992, now abandoned.

BACKGROUND OF THE INVENTION

1. Field of the Invention

The present invention relates to a busbar conductor that forms internal circuits of an electric junction box used for connection of automotive electrical instrumentation circuits.

2. Description of the Prior Art

FIG. 4 shows one example of a conventional electric junction box. A case 3, made up of an upper case 1 and a lower case 2, contains a stack of busbar conductors 6, each of which consists of a plurality of busbars 4 and insulating substrate 5. Each busbar has upward or downward projecting tabs 7, which are introduced as connector terminals into connector insertion portions 8, fuse connectors 9 and the like provided to the upper case 1 (or the lower case 2).

A group of busbars 4 are conventionally formed from strips punched out to have desired patterns from the same material (conductive metallic plates of the same thickness, conductivity and material).

The width of each busbar in each layer is determined from a required cross sectional area calculated from the magnitude of current carried and the material's conductivity. The thickness of each busbar is determined by the plate thickness needed for providing the tab 7 with a required strength. The minimum width of each busbar is dictated by the conditions of the material punching process.

Since the number of busbars laid on one insulating substrate 5 is limited by the number of circuits required of an electric junction box and positions where the tabs 7 rise, there is an enough busbar accommodating space on the substrate. Because of this extra space, conventional busbars are often punched from the same material to have a width larger than the minimum busbar width.

SUMMARY OF THE INVENTION

The materials to be punched to form busbars are generally less costly as the conductivity becomes lower. However, the busbars produced by the conventional method, which punches the busbars from the same material, have unduly high quality because of the busbar punching work and the busbar arrangement employed. The cost and resource saving problems are the major drawbacks of the conventional method.

The present invention has been accomplished to overcome the above drawbacks and to provide a busbar conductor that saves material and reduces cost while satisfying safety requirements for heat dissipation.

To achieve the above objective, the busbar conductor of this invention is characterized in that a plurality of busbars of desired patterns are arranged on an insulating substrate and that the busbars are formed by being punched out selectively from two or more conductive metal plates with different conductivities.

With this invention, when the busbars that make up the busbar conductor in each layer are worked according to the heat dissipating capability—which depends on busbar patterns, wiring densities and stacking positions—and also to current carried, it is possible to select two or more appropriate busbar materials with different conductivities.

To achieve the above objective, there is also provided according to the present invention a stack of busbar conductors each comprising a plurality of busbars having desired patterns, and an insulating substrate on which said plurality of busbars are arranged, said plurality of busbars for one busbar conductor being collectively punched out from at least one conductive metal plate, the metal plate conductivity differing from one busbar conductor to another.

Hence, the busbars can be formed from an optimal material that meets such requirements as the current carried and the heat dissipating capability, sparing the use of unnecessarily high quality materials, which in turn lowers the material cost.

DETAILED DESCRIPTION OF PREFERRED EMBODIMENT

Figure 1:
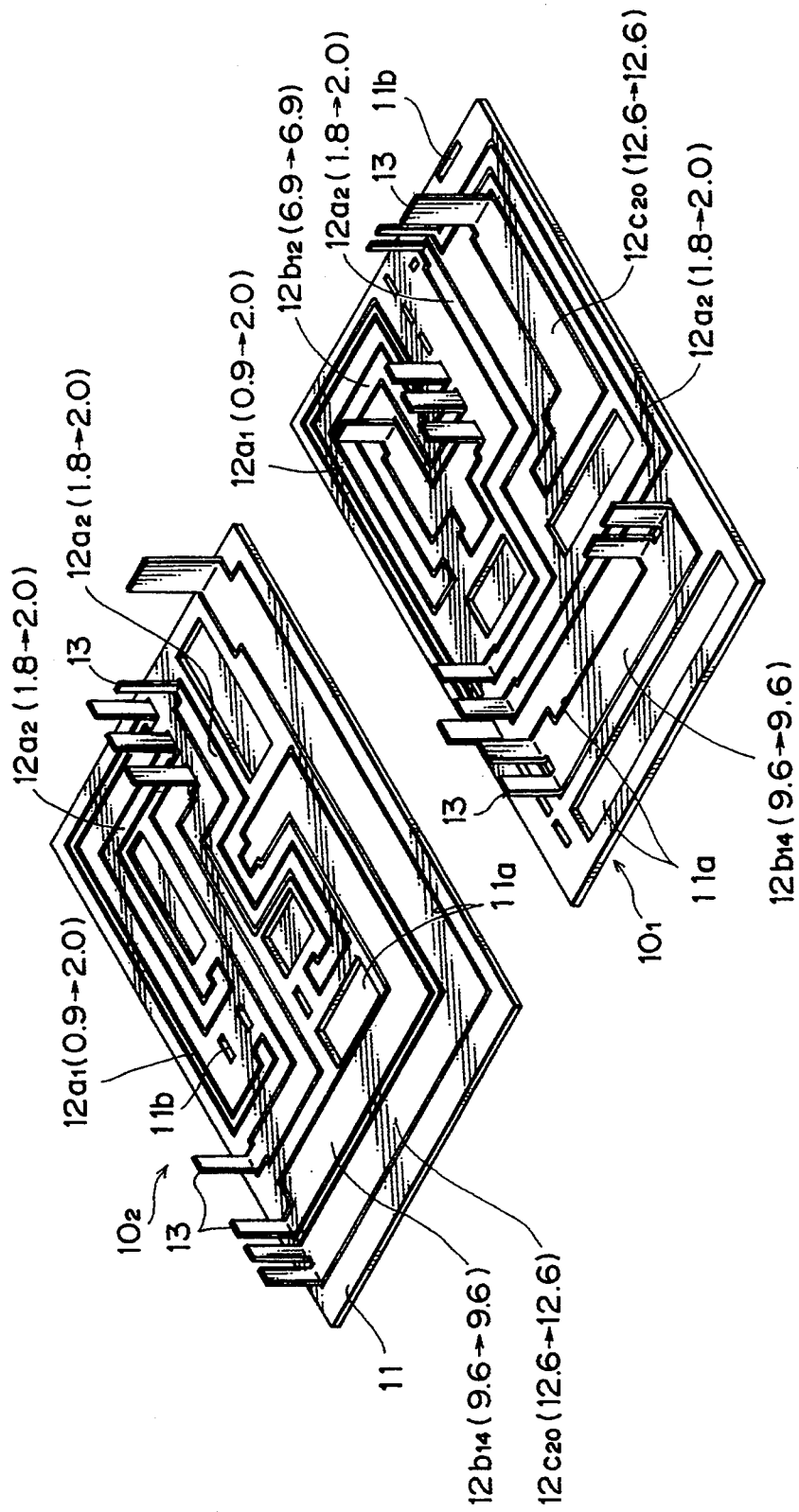
FIG. 1 is a perspective view of a busbar conductor as one embodiment of the invention.

In FIG. 1, reference numerals $10_1$, $10_2$ represent busbar conductors in the first and the second layer, each having a plurality of busbars 12 with tabs 13 arranged on an insulating substrate 11. These busbars 12 are punched from three materials a, b, c with different conductivities of 30%, 65% and 85%. Designated 11a is busbar accommodating grooves and 11b tab insertion holes.

Each busbar is represented by a symbol, e.g., $12a_1(0.9\rightarrow2.0)$, of which a indicates the material, a subindex 1 indicates that the current carried is 1 A, and numbers in parentheses (0.9→2.0) indicate the minimum busbar width 0.9 mm (shown to the left of arrow) and the actual width 2.0 mm (on the right). Similarly, a symbol $12b_{12}(6.9\rightarrow6.9)$ indicates that the material is b, the current carried 12 A, the minimum busbar width 6.9 mm and the actual busbar width 6.9 mm.

The low-current busbars $12a_1$, $12a_2$ that carry currents of 1A and 2 A respectively can be formed from the material having the minimum current conductivity. The use of low conductivity material rather contributes to securing a sufficient busbar width resulting in an increase in the strength of the busbars.

In this way, by changing the material from which to punch out the busbars according to the current to be carried, busbar material can be saved or prevented from being given excess quality, thus lowering the material cost and improving the workability of the busbars being punched.

Figure 2:
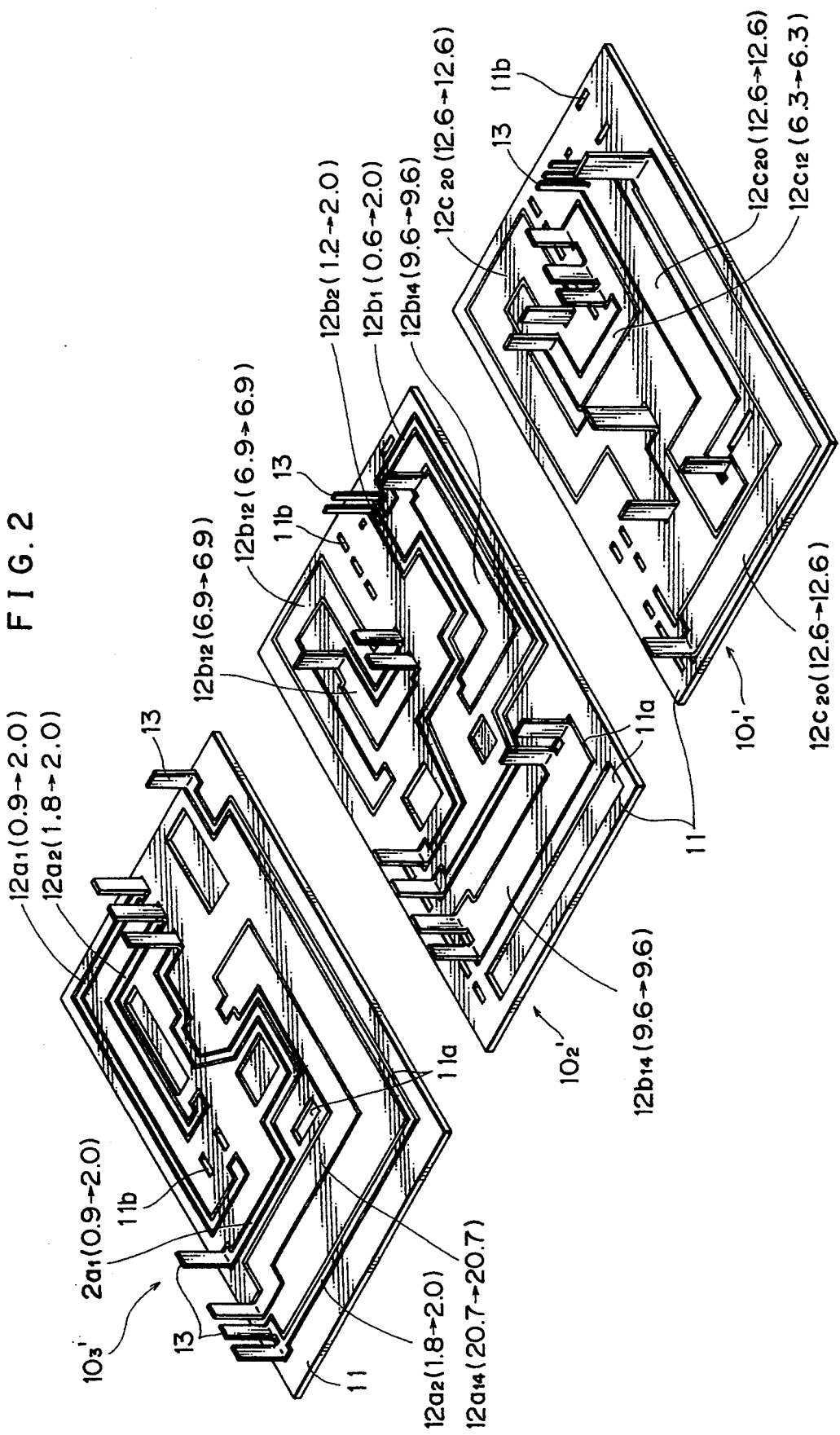
FIG. 2 is a perspective view of a busbar conductor as another embodiment of the invention.

While in the above example, the busbars 12 ($12a_1$, $12a_2$, . . . ) on the first and second layer busbar conductor $10_1$, $10_2$ are individually punched out from different materials, it is also possible to form busbars of one layer from the same material, with the material conductivity differing from one layer to another, as shown in FIG. 2.

Figure 3:
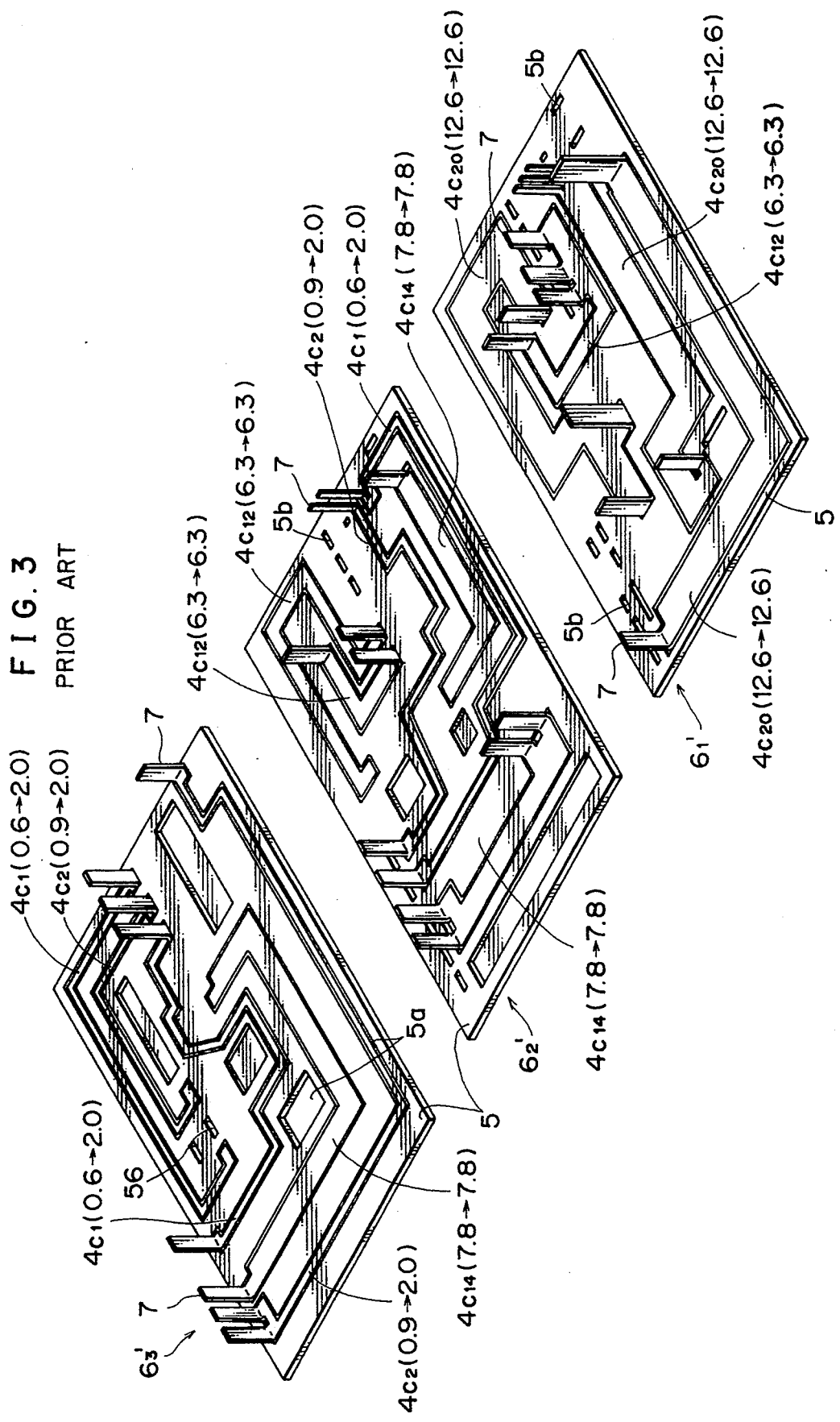
FIG. 3 is a perspective view of a conventional busbar conductor having the same circuit configuration as FIG. 2.
Figure 4:
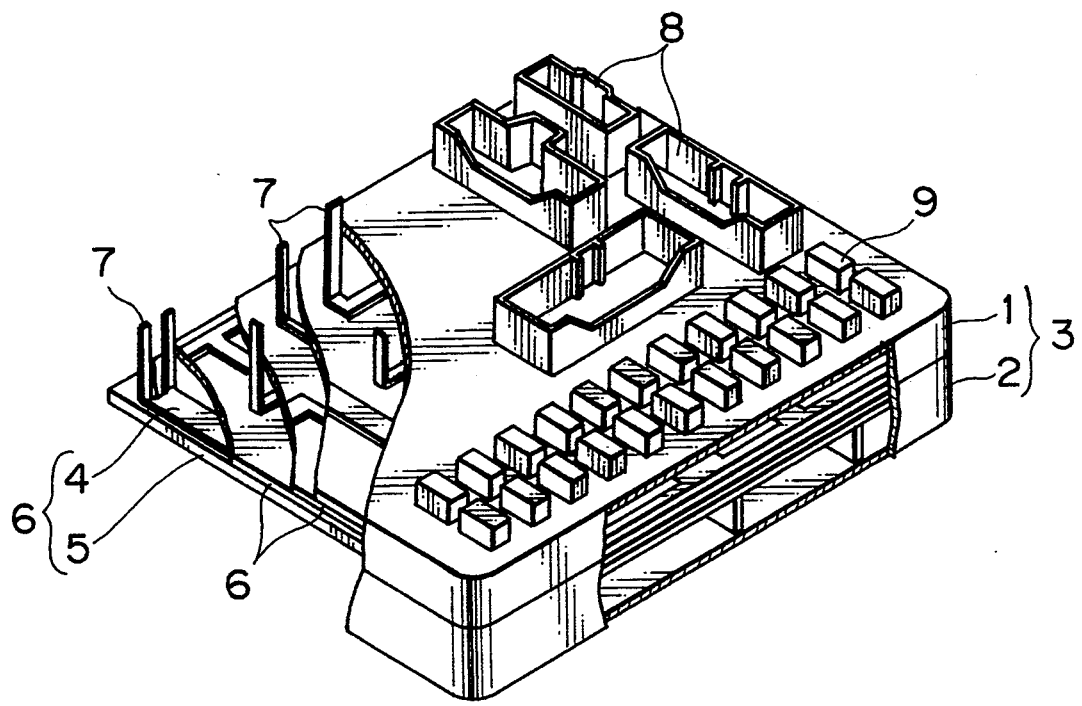
FIG. 4 is a partly cutaway perspective view of a conventional electric junction box.

The busbar conductors $6_1'$, $6_2'$ $6_3'$ in the first, second and third layers of FIG. 3 have a plurality of busbars 4

($4c_1$, $4c_2$, $4c_{12}$, ...) that are punched from the same material c (conductivity 85%).

FIG. 2 shows the busbar conductors $10_1'$, $10_2'$, $10_3'$ in the first, second and third layers having the same circuit configurations as in FIG. 3, with the busbars 12 in each layer being punched out from one of different materials c, b, a.

The busbars $12c_{12}$, $12c_{20}$, ... in the first layer are formed of the same material as the busbars $4c_{12}$, $4c_{20}$, ... of FIG. 3 and have the same busbar width, like conventional busbars. The busbars $12b_1$, $12b_2$, $12b_{12}$, ... in the second layer are formed by punching material b and are wider than the busbars $4c_1$, $4c_2$, $4c_{12}$, ... of FIG. 3 and thus easily worked. Their minimum and actual busbar widths are nearly equal. The same applies to the busbars $12a_1$, $12a_2$, ... in the third layer.

It is seen that even if the materials b, a with low conductivity instead of the conventional high quality material c are used on the second and third layer busbar conductors $10_2'$, $10_3'$, the necessary widths of busbars can be secured.

As described above, in making busbar conductors that form internal circuits of an electric junction box, this invention saves material from which to punch out the busbars and thereby reduces cost and improves workability of the busbars being punched.

What is claimed is:

1. A busbar conductor board comprising:
   an insulating substrate;
   a plurality of electrically separated busbars carried by the substrate, each busbar comprising a metallic strip of a respective material of a given conductivity; and
   the material of at least one of the busbars having a conductivity different from the material of the other busbars.

2. The board as defined in claim 1 wherein each busbar is dimensioned in cross section according to the required current capacity and the conductivity of its respective material, whereby for a given current capacity higher conductivity materials afford smaller busbar cross sections than lower conductivity materials.

3. A stacked busbar conductor board assembly comprising a plurality of separate busbar conductor boards arranged in a stack, each busbar conductor board comprising:
   an insulating substrate;
   a plurality of electrically separated busbars carried by the substrate, each busbar comprising a conductive metallic strip, the metallic strips on a given substrate comprising the same material and the same conductivity; and
   the busbars on at least one of the substrates having a different conductivity than on another substrate in the stack.

4. The assembly as defined in claim 3 wherein the busbars on each substrate comprise a material having a different conductivity than on each other substrate in the stack.

5. The assembly as defined in claim 3 wherein each busbar is dimensioned in cross section according to the required current capacity and the conductivity of its respective material, whereby for a given current capacity higher conductivity materials afford smaller busbar cross sections than lower conductivity materials.

6. A method of designing and manufacturing busbar conductor structures of the type having at least two busbar conductors having planar conductive body portions and end terminal portions, the body portions being of said at least two conductors being commonly disposed on the surface of a substrate having an area A, said method comprising the steps of:
   A) determining the current load to be carried by each of said conductors;
   B) determining the minimum conductor body portion width which is capable of carrying said current load using each of at least first and second alternative conductive materials of different conductivities and costs; and thereafter,
   C) applying to said substrate at least two spaced apart busbar conductors of a material and width which is chosen to minimize the busbar material cost while not exceeding the available area A of the substrate to be occupied by said busbar conductors.

* * * * *